United States Patent [19]

Bicknell

[11] Patent Number: 4,839,585
[45] Date of Patent: Jun. 13, 1989

[54] MAGNETIC FIELD SENSOR COIL FOR BEING FITTED AROUND A MOTOR SHAFT

[75] Inventor: John Bicknell, Alfold Bars, near Loxwood, England

[73] Assignee: Bonar Bray Limited, Waltham Cross, England

[21] Appl. No.: 57,218

[22] Filed: Jun. 2, 1987

[30] Foreign Application Priority Data

Jun. 6, 1986 [GB] United Kingdom ............... 8613789

[51] Int. Cl.⁴ ............... G01R 31/34; G01R 33/028; H02K 11/00; H01F 27/28
[52] U.S. Cl. ............... 324/158 MG; 829/605; 322/99; 324/127; 324/226; 324/258; 336/20; 336/84 R; 336/225
[58] Field of Search ............... 324/226, 234, 236–244, 324/258, 260, 262, 127, 158 MG; 336/20, 84 R, 84 C, 84 M, 174, 175, 206, 225–228; 29/605; 310/68 R, 68 B; 322/99

[56] References Cited

U.S. PATENT DOCUMENTS 3,434,052  3/1969  Fechant ............... 324/127
3,731,184  5/1973  Goldberg et al. ............... 336/20 X
3,885,213  5/1975  Rioux et al. ............... 324/127

FOREIGN PATENT DOCUMENTS 301631  6/1971  U.S.S.R. ............... 324/127

OTHER PUBLICATIONS

Penman et al; Condition Monitoring of Electrical Devices, IEEE Proceedings Section AàI, vol. 133, no. 3, part B May 1986, pp. 142-148, Stevenage, Herts, GT. Brit., Primary Examiner—Gerard R. Strecker
Attorney, Agent, or Firm—Chilton, Alix & Van Kirk

[57] ABSTRACT

A magnetic field sensor coil wherein the coil is formed into a shape comprising two generally C-shaped limbs (2, 3) one within the other, one of these limbs being covered by a magnetic screening material (4). In operation an e.m.f. is induced in each turn of the unscreened part of the coil (3) while no e.m.f. is induced in the screened part (4) and so the total e.m.f. induced is approximately equal to the e.m.f. that would be induced in a simple concentrically wound coil of the same number of turns and of the same dimensions as the unscreened portion of the coil. The coil according to the invention is especially suitable for use with a system for monitoring an electric motor where the coil may be placed adjacent the motor end plate concentrically around the motor shaft without having to uncouple the motor from its load. d 5 Claims, 3 Drawing Sheets

MAGNETIC FIELD SENSOR COIL FOR BEING FITTED AROUND A MOTOR SHAFT

This invention relates to a coil for sensing a magnetic field, and is useful, for example, for sensing the magnetic field around the shaft of an electric motor.

It is known to monitor the performance of an electric motor by detecting stray magnetic flux from the motor and providing corresponding electrical signals, performing frequency analysis of the flux signals and providing diagnostic information in dependence on variations in the flux signals. For example, for a motor powered by a 50 Hz supply, the amplitude of the flux signal components at 25, 50, 100 and 150 Hz can be monitored and an alarm provided in the event of a large and sudden change. It has been found empirically that a sensor coil to detect the flux signals is preferably placed against the motor end shield concentric with the motor shaft so as to pick up primarily rotor leakage flux which is generally axial, and in order to place a conventional circularly wound sensor coil in such a position on the motor it is necessary to uncouple the motor from its load.

It is an object of this invention to provide a sensor coil which achieves similar flux detection performance to a concentric coil whilst not requiring a motor to be uncoupled from the load in order to install the coil.

According to the invention there is provided a magnetic field sensor coil having a part which is screened from magnetic flux and a remaining part which is unscreened to allow detection of flux, the coil being formed into a shape in which it can be fitted around a motor shaft with both the screened and unscreened parts substantially encircling the shaft. Preferably the coil comprises a plurality of turns and preferably it is formed into two arcuate portions running side-by-side, one arcuate portion being magnetically screened and the other unscreened. Each turn of the coil thus follows the radially outer arcuate portion in one direction and returns to the starting point via the radially inner arcuate portion in the other direction. In use the coil is fitted around a motor shaft such that the shaft is positioned within the arcuate portions and parts of the coil are then drawn together so that each arcuate portion forms almost a complete loop substantially encircling the shaft.

Thus, viewed from another aspect, the invention provides a method of fitting a magnetic field sensor coil to an electric motor having a rotatable shaft, comprising forming a coil to have a reentrant inner portion within an outer portion, applying a magnetic screening material to one of said portions, disposing the coil around the shaft so that the shaft is positioned within the reentrant portion, and drawing together parts of the coil so that the reentrant portion substantially completely encircles the shaft. The screening material may be applied to either the inner or outer portion; the inner portion is shorter and so to apply the screening material to the inner portion will reduce the cost of screening material used. The path of the screened part does not substantially affect the operation of the coil, but for ease of manufacture and to minimise its length it will conveniently be arcuate such that it is generally circular when fitted around the shaft.

In operation, an e.m.f. is induced in each turn of the unscreened part of the coil whilst no e.m.f. is induced in the screened part. Since the e.m.f. induced in each turn of the unscreened part of the coil is approximately equal to that which would be induced in each turn of a simple concentric circular coil, the total e.m.f. is approximately equal to the e.m.f. induced in a concentric coil of the same number of turns. (However, the resistance of the coil is likely to be higher than an equivalent simple circular coil since the wire in the screened part does not contribute to the e.m.f. but adds to the resistance.)

The invention also provides a method of making a magnetic field sensor coil, comprising winding a circular coil, forming one part of the coil into a reentrant arc so that the path of the coil follows two generally C-shaped limbs, one within the other, and applying a magnetic screening material to one limb of the coil. The step of forming the coil to follow two generally C-shaped limbs may comprise taking a circular coil (which may be wound on a circular former, for example) and fixing it to a non-magnetic support formed into the desired shape. For example a copper wire support which does not form a closed loop has been found suitable. Magnetic screening material, e.g. mumetal, may then be applied to one limb of the coil, e.g. by winding mumetal tape around the limb of the coil. If the coil is to be exposed to very high magnetic fields at which the mumetal may become saturated, it may be beneficial to provide an outer layer of Radiometal which has a lower permeability but saturates at a higher field strength. If it is desired to provide screening from electrical noise, the entire coil may be provided with an electric screen. Preferably aluminium tape is wound around the entire supported coil before the magnetic screening material is applied. Preferably the entire completed coil is covered with an insulating material, for example a self-annealing tape.

An embodiment of the invention will now be described by way of example and with reference to the accompanying drawings, in which.

Figure 1:
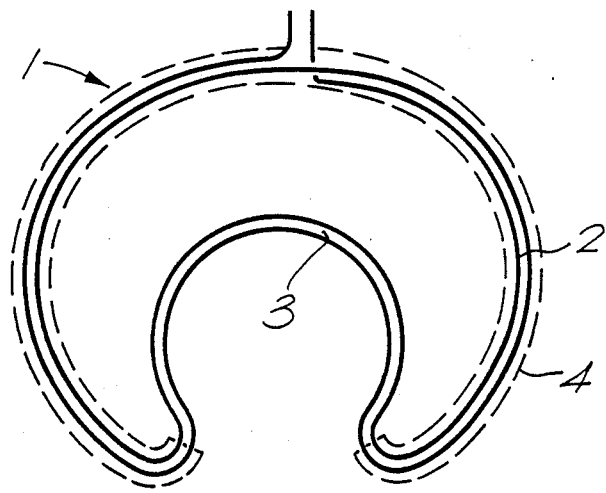
FIG. 1 is a schematic view of a coil according to the invention prior to installation.
Figure 2:
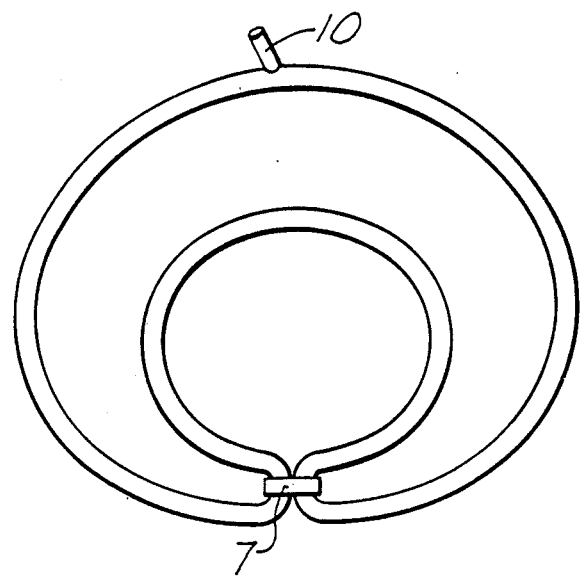
FIG. 2 is a view of the coil after installation.
Figure 3:
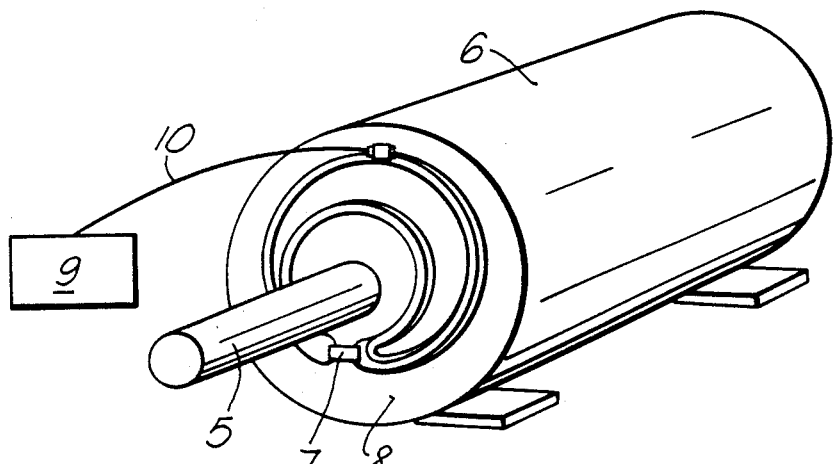
FIG. 3 is a perspective view showing the coil in position on a motor.
Figure 4:
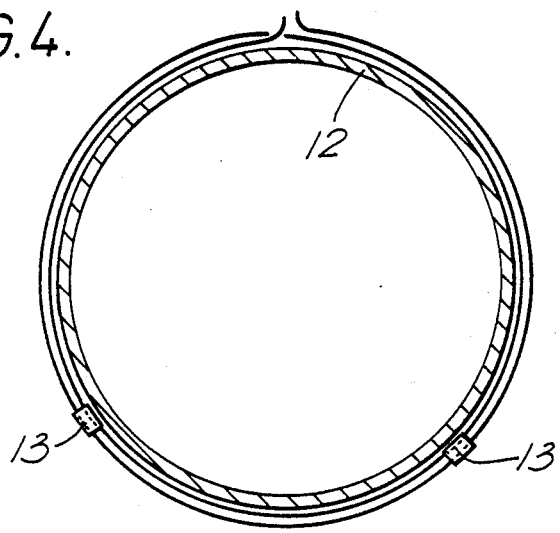
FIGS. 4 to 8 are diagrams useful for explaining a method of making a coil according to the invention.
Figure 5:
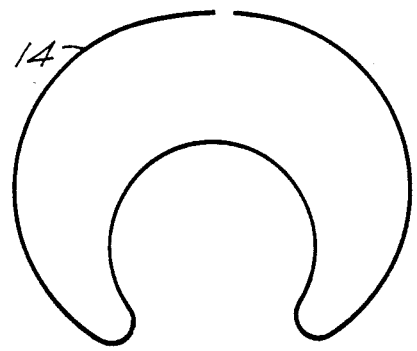

Referring to the drawings, a magnetic field sensor coil 1 comprises two generally C-shaped arcuate portions 2 and 3. The portion 2 is covered with a magnetic screen 4 of suitable material, e.g. mumetal foil. The path of the winding of the coil follows the radially outer portion in one direction and returns to the starting point via the radially inner portion in the opposite direction. For clarity only two turns are shown in FIG. 1, but in practice a considerably higher number of turns, e.g. 2000, may be used. In use, parts of the coil are drawn together around the output shaft 5 of a motor 6 and secured by a clip 7 of any suitable design. The coil may be fixed to the end shield 8 of the motor by suitable fixings, e.g. adhesive cable clips, and the ends of the coil winding are connected to a monitoring device 9, preferably by means of a screened cable 10.

Figure 6:
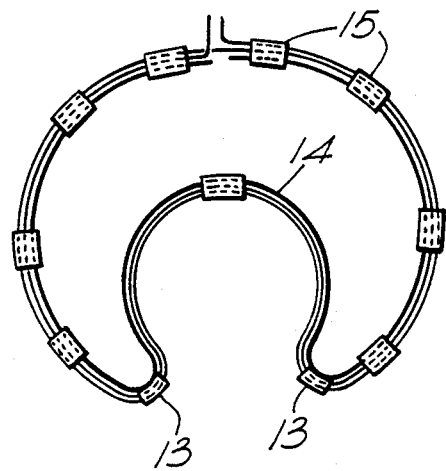
Figure 7:
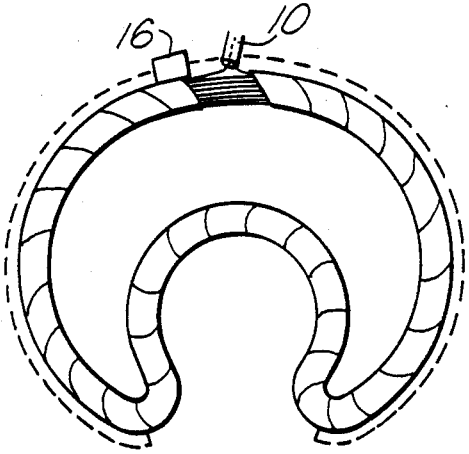
Figure 8:
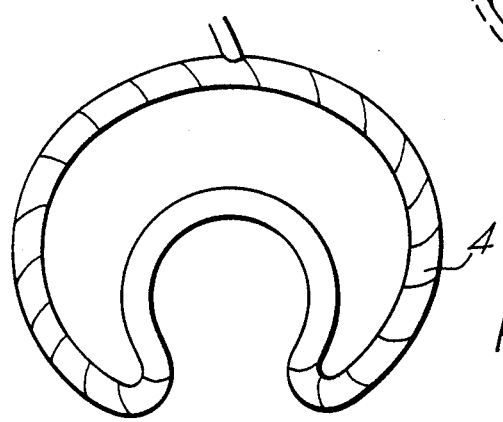

Referring now to FIGS. 4 to 8, the coil 1 may be constructed as follows: firstly a circular coil is wound on a former 12 and loosely held, e.g. by tape 13. Next, a non-magnetic support 14, e.g. in the form of a bent copper wire which does not form a closed loop, is taken and the coil is attached to the support 14, e.g. by means of tape 15, so as to follow the shape of the support (FIG. 6). Next an electrical screen, e.g. of aluminium foil 16, is spiral-wound over the entire coil and support to provide immunity from electrical (r.f.) noise. At the same time a screened lead 10 may be connected to the ends of the coil, the screen of the lead being also connected to the screen 16. In the next stage, one limb of the coil is covered with a magnetic screening material 4, e.g. mumetal tape. The inner limb could be screened so as to reduce the amount of material used, although it may be found in practice more convenient to screen the outer limb as indicated by the broken line in FIG. 7 and as shown in FIG. 8. If desired for improved magnetic screening, a second magnetic screen, e.g. of Radiometal, may be applied over the first. Finally, the entire coil is coated in an insulating material, e.g. self-annealing tape, and the finished coil is ready for use.

It may be seen that the coil forms a 'Circlip' (snap-ring) shape which may be opened for fitting over a motor shaft and reclosed to give substantially complete circumferential coverage of the motor shaft. We have found that successful results may be achieved if the span of the unscreened portion is no more and no less than 360° within a few percent.

I claim:
1. A magnetic field sensor coil having first and second generally C-shaped portions, one within the other, screening means surrounding said first portion for screening said first portion of said sensor coil from magnetic flux, said sensor coil further having said second portion unscreened to allow detection to flux, the shape of the coil being alterable such that the coil can be fitted around a motor shaft and reformed so that both the first screened portion and the second unscreened portion substantially surround the shaft.
2. A magnetic field sensor coil as claimed in claim 1 wherein the coil comprises a plurality of turns.
3. The coil as claimed in claim 1 wherein said magnetically screened portion comprises a coil portion having mumetal tape wound thereabout.
4. The coil as claimed in claim 1 wherein the entire completed coil is covered with an insulating material.
5. The coil as claimed in claim 4 wherein said insulating material is self-annealing tape.

* * * * *